United States Patent [19]
Lütteke

[11] Patent Number: 4,527,130
[45] Date of Patent: Jul. 2, 1985

[54] PUSH-PULL MICROWAVE OSCILLATOR WITH FUNDAMENTAL AND SECOND HARMONIC OUTPUTS

[75] Inventor: Georg Lütteke, Aachen, Fed. Rep. of Germany

[73] Assignee: U.S. Philips Corporation, New York, N.Y.

[21] Appl. No.: 416,753

[22] Filed: Sep. 10, 1982

[30] Foreign Application Priority Data

Sep. 14, 1981 [DE] Fed. Rep. of Germany ....... 3136348

[51] Int. Cl.³ .................... H03L 7/00; H03B 25/00; H03B 5/18; H03K 3/26
[52] U.S. Cl. .................... 331/36 C; 331/60; 331/76; 331/100; 331/114; 331/117 R; 331/117 D; 331/177 V
[58] Field of Search .................... 331/36 C, 45, 60, 76, 331/96, 100, 117 R, 117 D, 114, 177 V

[56] References Cited

U.S. PATENT DOCUMENTS 3,939,429  2/1976  Löhn et al. ..................... 325/432
4,360,790  11/1982  Heise ............................. 331/114

FOREIGN PATENT DOCUMENTS 594335  3/1960  Canada ............................ 331/114

Primary Examiner—Eugene R. LaRoche
Assistant Examiner—D. M. Mis
Attorney, Agent, or Firm—Robert J. Kraus

[57] ABSTRACT

A push-pull microwave oscillator circuit, including two transistors, for producing the second harmonic of a fundamental frequency at a symmetry point of the circuit which is connected to the bases of the transistors through identical arrangements of circuit elements. The circuit includes tuning means coupled to at least one of the transistors, an output and an input. The output, which is utilized to provide to a phase comparison means an output signal at the fundamental of the second harmonic frequency, is coupled to the base of at least one of the transistors by a capacitive impedance. The input, which is utilized to receive a tuning signal produced by the phase comparison means in response to the output signal, is coupled to the tuning means.

7 Claims, 2 Drawing Figures

PUSH-PULL MICROWAVE OSCILLATOR WITH FUNDAMENTAL AND SECOND HARMONIC OUTPUTS

BACKGROUND OF THE INVENTION

The invention relates to a push-pull microwave oscillator having two transistors, in which a signal with the frequency of the second harmonic (twice the frequency of the fundamental frequency) is taken from a symmetry point of the oscilaor.

Such a circuit is disclosed in DE-AS No. 23 34 570, corresponding to U.S. Pat. No. 3,939,429 (see FIGS. 6 and 7).

When the frequency of such an oscillator must be kept constant accurately, the phase can be compared with and adjusted in known manner with respect to a reference oscillator. As is customary, the reference oscillation has a lower frequency, because it can then be kept constant to a greater extent regardless of external influences, for example fluctuations in the supply voltage or the temperature, and because it can be more easily conveyed over a transmission path. If, however, the microwave oscillations must be compared, their frequencies must be divided. Dividers for high frequencies, for example more than 1.5 GHz are difficult to implement.

SUMMARY OF THE INVENTION

The invention has for its object to provide a microwave oscillator with a simple yet effective frequency control (stabilization). According to the invention, this object is accomplished in an oscillator of the type described in the opening paragraph in that a portion of the fundamental frequency is taken from the base electrode of at least one transistor via a capacitive impedance.

The invention is based on the idea that a harmonic oscillator produces a lower frequency reduction than the supplied harmonic so that, for example between the second harmonic and the fundamental frequency there is a frequency division in the ratio 2:1.

An additional frequency divider can be controlled with a small portion of the fundamental frequency energy withdrawn from the harmonic oscillator. The withdrawal of the fundamental frequency energy must be effected in such a way that the harmonic amplitude is as low as possible, for example by reducing the drive of the active element by the harmonic frequency, it further being a requirement that at the point of withdrawal the amplitude of the fundamental frequency is large compared with the amplitude of the harmonic oscillation.

In accordance with a preferred embodiment of the invention, the base and/or the emitter of grounded-collector transistors are connected to active resistances via a capacitive inductance, whose windings are provided in one plane in parallel with a ground plate, for example on an insulating substrate, and which is rated so that at its input it has a low capacitive impedance with respect to ground and a higher inductive or also capacitive impedance with respect to its output which is connected to the resistance. As a result thereof, the capacitive impedance required for the feedback and/or tuning is provided and a direct current supply network with resistors connected thereto is also adequately decoupled.

In accordance with another embodiment, at least one resistance is connected to the oscillator via a tuned line which has a high impedance at the relevant frequency with respect to the oscillator, this line being, for example, a quarter-wave length line. Thus, the resistance required for the direct voltage adjustment can be decoupled from the microwave oscillations.

In accordance with yet another embodiment of the invention, the fundamental-frequency resonant circuit comprises a capacitance which is controllable by a voltage and at least one line for applying the tuning voltage has a high impedance, more specifically a reactance at the relevant applied oscillation frequency. Consequently, the frequency range in the case of frequency modulation can be increased because the ohmic resistors of the network may have values which are below the tuning direct voltage without causing disturbing attenuation of the microwave, the time constant formed together with the tuning capacitance being, however, correspondingly reduced.

BRIEF DESCRIPTION OF THE DRAWING

The invention will now be further described by way of example with reference to the accompanying drawing in which.

DESCRIPTION OF THE PREFERRED EMBODIMENT

Figure 1:
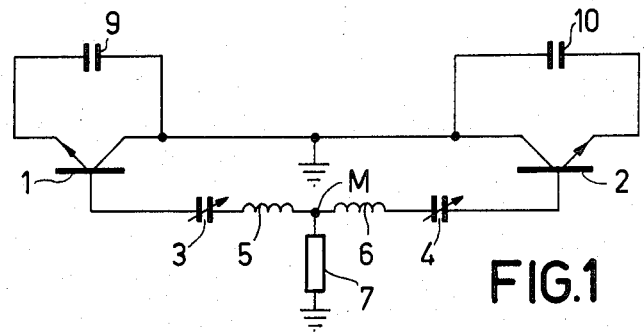
FIG. 1 shows the prior art basic circuit diagram of the relevant harmonic oscillator and FIG. 2 shows a schematic circuit diagram of an embodiment of the invention.

The circuit, which is disclosed in DE-AS No. 23 34 570 FIGS. 6 and 7 is based on a basic circuit diagram as shown in FIG. 1. The circuit is symmetrically constructed with two npn-transistors 1 and 2, whose collectors are connected to ground. Arranged between the bases of the transistors 1 and 2, is the series arrangement of variable, capacitors 3 and 4, respectively and inductances 5 and 6, respectively, by means of which the circuit is tuned to the fundamental frequency. A symmetry point M, with respect to the series impedances 3, 4, 5, 6 is connected to ground through a load resistor 7. Harmonic oscillations may be applied to the point M via a wave guide. Capacitors 9 and 10 are arranged between the emitters and collectors of the transistors 1 and 2, respectively, for adjusting the feedback of the transistors. Internal capacitances and stray capacitances in the network are not shown, but affect feedback and tuning. Intrinsic attenuation, which affects the fundamental frequency, must be kept as low as possible in order to enable a large drive and consequently a correspondingly high harmonic power.

Figure 2:
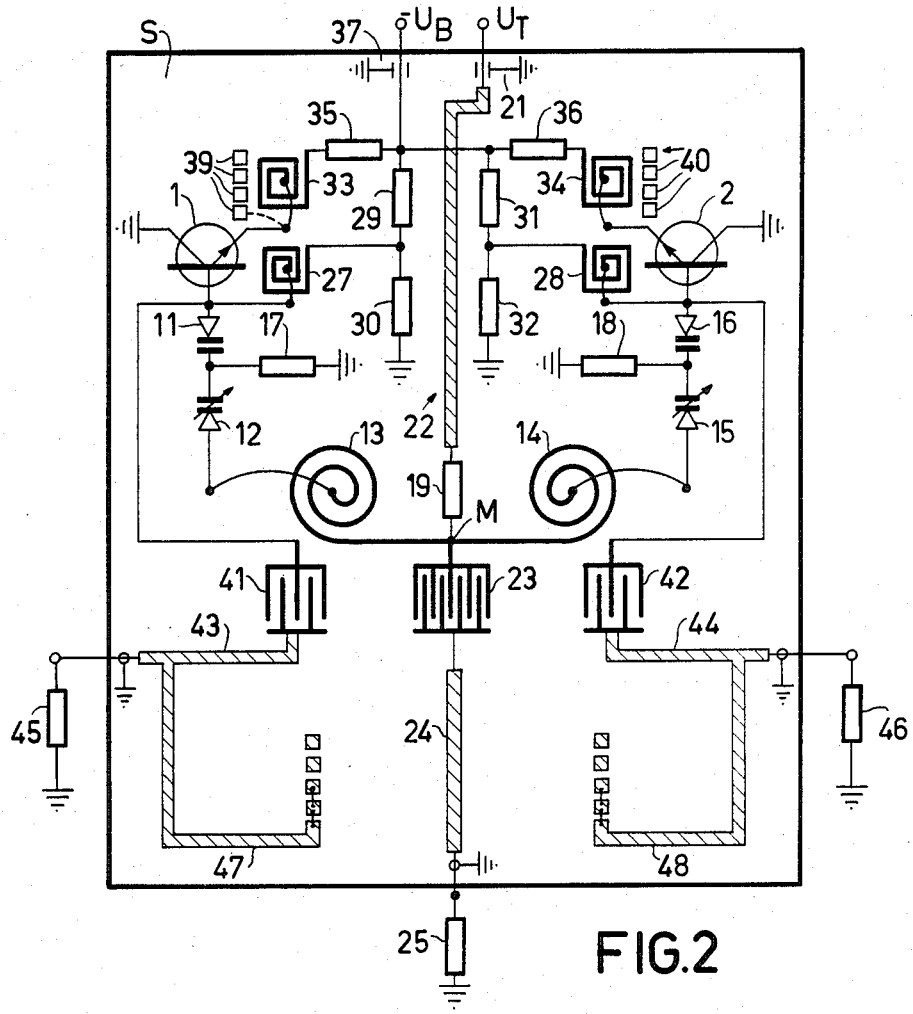

In FIG. 2 there is between the bases of the transistors 1 and 2 the series arrangement of a first decoupling capacitor 11, which is in the form of a reverse-biased diode, a first tuning diode 12, a first inductance 13, a second inductance 14, a second tuning diode 15 and a second isolating capacitor 16, which is also in the form of a reverse-biased diode. The junction between the diodes 11 and 12 on the one hand and 15 and 16 on the other hand is connected to ground via a first and a second isolating resistor 17 and 18, respectively, each having a value of 3000 Ohms. The junction M between the inductances 13 and 14 is connected to a control voltage source $U_T$ via a 300 Ohm resistor 19. This source produces a d.c. voltage for tuning the capacitance diodes 12 and 15. It may, however, alternatively receive a signal voltage for frequency modulating the oscillations produced. The tuning voltage $U_T$ is supplied via a feed-through capacitor 21, whose other end is connected to ground, and a stripline 22, which is tuned to a quarter-wavelength of the 2.4 GHz harmonic. While at point M the 1.2 GHz fundamental frequency vanishes, the harmonic oscillations at this point have a large amplitude. For a.c. voltage the tuned line 22 is connected to ground through capacitor 21; it consequently has at its lower end a maximum impedance so that only a minimal harmonic current flows across the active resistor 19.

The harmonic oscillations at point M are applied via an interdigital capacitor 23 to a 50 Ohm-line 24, whose other end is connected to a 50 Ohm load resistor 25. The oscillator shown in FIG. 2 is assembled on an insulating substrate plate S, which may consist of $Al_2O_3$ or of Teflon or the like, on which conductive coatings of gold or copper are provided in thin-film technique. The bottom side of the plate S is coated with a metal ground coat. The capacitor 23 which is in the form of comb-like intermeshing coats operates as a capacitive $\pi$-network, by means of which a transformation is effected between the point M and the line 24.

The capacitors 11 and 16 have for their only object to decouple the direct current circuits of the bases and the tuning voltage $U_T$ from each other. Advantageously, a voltage-dependent capacitance diode may alternatively be used for this purpose, which may however have higher capacitance values, whose variations in response to the applied voltage have no noticeable affect on the tuning of the oscillator.

The bases of the transistors 1 and 2 are connected via planar inductances 27 and 28, respectively, to the taps of voltage dividers 29, 30 and 31, 32, respectively, which are formed by resistors 29 and 31 of 270 Ohm and resistors 30 and 32 of 1200 Ohm, respectively, which are arranged between a supply voltage $-U_B$ and ground. The windings of the coils 27 and 28 which are provided in the plane of the substrate also have capacitances with respect to the ground coating. They are however rated such that a high impedance occurs at their input which faces the base, so that the bases are adequately decoupled from the active resistors 29 to 32.

The emitters of the transistors 1 and 2 are connected via coils 33 and 34, respectively, and 12 Ohm emitter resistors 35 and 36, respectively, to the voltage source $-U_B$, whose terminal is decoupled via a feedthrough capacitor 37. The windings of the coil 33 also have capacitance to ground and are tuned so that at the input of the emitter the capacitance required for the feedback (see 9 and 10 in FIG. 1) is produced and that for the fundamental frequency and the harmonics an inductive decoupling with respect to d.c. voltage resistors 35 and 36, respectively is established. Adjacent to the coils 33 and 34 partial coatings 39 and 40, respectively are provided. These coatings have defined capacitance values with respect to the coating applied on the bottom side of the substrate. When one or more of the partial coatings are connected to the emitter, the emitter-collector capacitance can be increased by small amounts, so that balancing, if required, is possible.

In accordance with the invention, a 50 Ohm load impedance 45 from which a portion of the fundamental frequency can be taken, for example to control a frequency divider, is connected to the base electrode of the transistor 1 via a strip line 43 and an interdigital capacitor 41, which acts as a capacitive transfer impedance. The stripline 43 may optionally operate as an impedance transformer. A further stripline 47 which is open at the end and tuned to the higher (e.g. second) harmonic is connected to the end of the line 43. This further stripline operates as an absorption circuit at the end of the line 43. At the end of the line 47 some further line components are shown which may be connected as occasion demands in order to tune the line length to the required resonance.

It is advantageous, in order to ensure the symmetry, to connect the same elements as are connected to the base of the transistor 1, to the base of the transistor 2. Therefore, a capacitive impedance 42, a stripline portion 44, a load resistor 46 and an absorption stripline 48 are connected to the base of transistor 2.

What is claimed is:

1. A push-pull microwave oscillator circuit including first and second transistors for producing the second harmonic of a fundamental frequency at a symmetry point of the circuit which is connected to the bases of the transistors through first and second identical arrangements of circuit elements, said circuit including:
   (a) tuning means coupled to at least one of the transistors;
   (b) an output, coupled to the base of at least one of the transistors by a capacitive impedance, for providing to a phase comparison means an output signal at the fundamental of the second harmonic frequency produced at the symmetry point; and
   (c) an input, coupled to said tuning means, for receiving a tuning signal produced by the phase comparison means in response to said output signal.

2. An oscillator circuit as in claim 1 including an impedance transformer electrically-connected between the capacitive impedance and the output.

3. An oscillator circuit as in claim 1 including a transmission line electrically-connected between the capacitive impedance and the output, said transmission line having a high impedance at the second harmonic frequency.

4. An oscillator circuit as in claim 1, 2 or 3 including a series resonant circuit for the second harmonic frequency electrically-connected between the output and ground.

5. An oscillator circuit as in claim 1, 2 or 3 where the collector of each of the first and second transistors is referenced to a predetermined voltage, and where the base and emitter of each of the first and second transistors is electrically-connected to a respective dc voltage source through a respective capacitive inductance having planar windings extending parallel to a ground plane.

6. An oscillator circuit as in claim 1, 2 or 3 where said tuning means comprises respective voltage-controllable capacitors electrically-connected to the bases of the first and second transistors, and where said input is electrically-connected to said voltage-controllable capacitors by means of a transmission line.

7. An oscillator circuit as in claim 6, where said transmission line is tuned to a quarter-wavelength of the harmonic frequency.

* * * * *